(12) United States Patent
Lee

(10) Patent No.: US 6,304,207 B1
(45) Date of Patent: Oct. 16, 2001

(54) CYCLIC ANALOG TO DIGITAL CONVERTER WITH MIS-OPERATIONAL DETECTOR

(75) Inventor: Dae Hun Lee, Daeku (KR)

(73) Assignee: Hyundai Electronics Industries Co., Ltd., Kyoungki-Do (KR)

(*) Notice: Subject to any disclaimer, the term of this patent is extended or adjusted under 35 U.S.C. 154(b) by 0 days.

(21) Appl. No.: 09/432,252

(22) Filed: Nov. 2, 1999

(30) Foreign Application Priority Data

Nov. 26, 1998 (KR) .................................. 98 50978

(51) Int. Cl.[7] .............................. H03M 1/06; H03M 1/34
(52) U.S. Cl. ............................................. 341/163; 341/118
(58) Field of Search .................................... 341/163, 161, 341/120, 118, 156

(56) References Cited

U.S. PATENT DOCUMENTS

| | | | |
|---|---|---|---|
| 4,907,002 | * | 3/1990 | Kawada .................................. 341/172 |
| 5,248,970 | * | 9/1993 | Sooch et al. ........................... 341/120 |
| 5,363,100 | * | 11/1994 | Bailey et al. ...................... 341/118 X |
| 5,424,738 | * | 6/1995 | Barroue et al. ....................... 341/118 |

OTHER PUBLICATIONS

Shih et al., "Reference Refreshing Cyclic Analog–to–Digital and Digital–to Analog Converters," IEEE Journal of Solid–State Circuits, vol. sc–21, No. 4, Aug. 1986.

* cited by examiner

*Primary Examiner*—Patrick Wamsley
(74) *Attorney, Agent, or Firm*—Morgan, Lewis & Bockius LLP

(57) ABSTRACT

A cyclic analog/digital converter includes a first multiplexer for selectively outputting an analog signal and a first input signal pursuant to a control signal; a sample/hold unit for sampling/holding an output signal from the first multiplexer; a doubling amplifier for amplifying an output signal from the sample/hold unit; a first comparator for comparing an output signal from the doubling amplifier with a reference voltage; a second multiplexer for selectively outputting the reference voltage and a ground voltage pursuant to an output signal from the first comparator; a voltage subtracter for subtracting output signals from the doubling amplifier and the second multiplexer, and providing the first input signal to the first multiplexer; and a mis-operation detector for detecting a mis-operation of the first comparator, and controlling an operation of the first multiplexer.

18 Claims, 4 Drawing Sheets

CYCLIC ANALOG TO DIGITAL CONVERTER WITH MIS-OPERATIONAL DETECTOR

This Application claims the benefit of Korean Application No. 50978/1998 filed on Nov. 26, 1998, which is hereby incorporated by reference.

BACKGROUND OF THE INVENTION

1. Field of the Invention

The present invention relates to a cyclic analog/digital converter, and in particular, to an analog/digital converter capable of preventing a digital signal from being mistakenly outputted due to a mis-operation of an internal comparator.

2. Description of the Related Art

In general, a digital signal may be processed by many useful digital processes. This applies equally to audio information, video information or information corresponding to changes in other physical parameters. In order to perform various digital techniques on a digital signal, an analog signal should first be converted to a digital signal with certain bits.

FIG. 1 is a block diagram illustrating a conventional cyclic analog/digital converter including: a first multiplexer 10; a sample/hold until 12; a doubling amplifier 14; a comparator 16; a second multiplexer 18; and a voltage subtracter 20. The first and second multiplexers 10 and 18 each includes three input ports (a–c) and an output port (d), respectively. The input port (b) functions as a control port. The voltage subtracter 20 includes two input ports (a, b) and an output port (c). The doubling amplifier 14 outputs an output signal from the sample/hold unit 12 as it is when the most significant bit (MSB) of the digital signal is determined. The doubling amplifier 14 amplifies the output signal from the sample/hold unit 12 two times when the next-succeeding bit of the digital signal is determined.

The operation of the conventional cyclic analog/digital converter will now be described.

When an analog signal $V_{IN}$ is inputted through the input port (a) of the first multiplexer 10, the first multiplexer 10 selectively outputs to its output port (d) the analog signal $V_{IN}$ and an output signal from the subtracter 20 inputted through the input port (c) according to a control signal $V_{CON}$ level applied to the input port (b). For example, the first multiplexer 10 outputs the analog signal $V_{IN}$ when the control signal $V_{CON}$ is at a high level, and outputs the output signal from the subtracter 20 when the control signal $V_{CON}$ is at a low level. Here, the control signal $V_{CON}$ is at a high level only at the time of sampling the analog signal $V_{IN}$. In all other cases, the control signal $V_{CON}$ is always at a low level.

The analog signal $V_{IN}$ outputted from the first multiplexer 10 is sampled in the sample/hold unit 12 and inputted to the doubling amplifier 14. The doubling amplifier 14 outputs the output signal from the sample/hold unit 12 at it is to the comparator 16 in the MSB determination. The comparator 16 compares the sampled analog signal $V_{IN}$ inputted through a non-inverting terminal (+) with a reference signal $V_{REF}$ inputted through an inverting terminal (−), outputs a high-level output signal $V_{OUT}$ when the output signal from the doubling amplifier 14 is greater than the reference signal $V_{REF}$, and outputs a low-level output signal $V_{OUT}$ when the output signal from the doubling amplifier 14 is smaller than the reference signal $V_{REF}$. Accordingly, the output signal $V_{OUT}$ from the comparator 16 is a most significant bit (MSB) of the digital signal with N bits.

The second multiplexer 18 is similar to the first multiplexer 6 in its structure and operation.

The input port (b) of the second multiplexer 18 is a control port using the output signal $V_{OUT}$ from the comparator 16 as a control signal. The input port (a) of the second multiplexer 18 receives the reference signal $V_{REF}$ and the input port (c) is grounded. As a result, the second multiplexer 18 outputs the reference signal $V_{REF}$ when the output signal $V_{OUT}$ from the comparator 16 is at a high level, and outputs a ground voltage $V_{SS}$ when the output signal $V_{OUT}$ thereof is at a low level.

The voltage subtracter 20 subtracts the output signal from the amplifier 14 inputted through its input port (a) and the output signal from the first multiplexer 18 inputted through its input port (b), and provides a subtraction result to the input terminal (c) of the first multiplexer 10 through its output port (c). However, the control signal $V_{CON}$ inputted to the input port (b) of the first multiplexer 10 is maintained at a low level at this time. Thus, the output signal from the subtracter 20 is applied to the sample/hold unit 12 through the output port (d).

The sample/hold unit 12 holds the output signal from the first multiplexer 10, and provides it to the doubling amplifier 14. The doubling amplifier 14 amplifies the output signal from the sample/hold unit 12 two times, and outputs it to the comparator 16. Accordingly, the comparator 16 compares the output signal from the doubling amplifier 14 with the reference signal $V_{REF}$, and outputs the high-level or low-level output signal $V_{OUT}$. As a result, the output signal $V_{OUT}$ from the comparator 16 is set to be a next-succeeding bit value of the digital signal.

Accordingly, a desired N bits digital can thus be obtained by repeatedly carrying out the above-described process.

As illustrated in FIG. 1, the conventional cyclic analog/digital converter has a structure for consecutively cycling the sampled analog signal $V_{IN}$ as many times as the desired number of bits, and is mostly used to obtain the precise digital signal in a low-velocity operation.

Here, the comparator 16 determines the size of the signal to be converted. Therefore, the performance and structure of the comparator 16 is very important.

In general, an operational amplifier is used as the comparator. However, an operational amplifier usually generates an output offset voltage because parameters used for its input terminal are not exactly identical to one another. Therefore, in order to remove the output offset voltage, a circuit for applying an input offset voltage is required. The input offset voltage is strongly influenced by a change of temperature or supply power. Consequently, the comparator may cause a mis-operation of the analog/digital converter, thus outputting a wrong result due to an internally or externally generated offset voltage value or a change thereof.

Accordingly, in the conventional cyclic analog/digital converter, the comparator may operate abnormally due to the offset voltage value or a temporary change thereof, thereby causing a serious problem in an application system where precise operations are important.

SUMMARY OF THE INVENTION

Accordingly, the present invention is directed to a cyclic analog/digital converter that substantially obviates one or more of the problems due to limitations and disadvantages of the related art.

An object of the present invention is to provide a cyclic analog/digital converter which can convert an analog signal to a digital signal.

Another object of the present invention is to provide a cyclic analog/digital converter which can provide a precise digital signal, regardless of variations in the input offset of a comparator.

A further object of the present invention is to provide a cyclic analog/digital converter which can provide a precise digital signal regardless of environmental temperature variations and/or related supply power variations.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereon as well as the appended drawings.

To achieve these and other advantages and in accordance with the purpose of the invention, as embodied and broadly described, a cyclic analog/digital converter of the present invention includes a first multiplexer selectively outputting an analog signal and a first input signal pursuant to a control signal; a sample/hold unit sampling/holing an output signal from the first multiplexer; a doubling amplifier amplifying an output signal from the sample/hold unit; a first comparator comparing an output signal from the doubling amplifier with a reference voltage; a second multiplexer selectively outputting the reference voltage and ground voltage according to an output signal from the first comparator; a voltage subtracter subtracting the output signals from the doubling amplifier and second multiplexer, and providing a first input signal to the first multiplexer; and a mis-operation detector detecting a mis-operation of the first comparator, and controlling an operation of the first multiplexer.

The mis-operation detector of the present invention includes a second comparator having opposite input signals to the first comparator; a controller receiving the outputs from the first and second comparators, discriminating an operational state of the first comparator, and storing the output signal from the first comparator as a decision bit pursuant to a discrimination signal; and a selector selectively outputting the discrimination signal from the controller and an external control signal as a control signal of the first multiplexer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of the specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

According to the present invention, a mis-operation of a comparator can be detected in a cyclic analog/digital converter. In order to detect the mis-operation of the comparator, two comparators having opposite inverting inputs and non-inverting inputs are provided in the cyclic analog/digital converter of the present invention. Output signals from these two comparators are detected and used to determine whether the comparators are operating normally.

Figure 1:
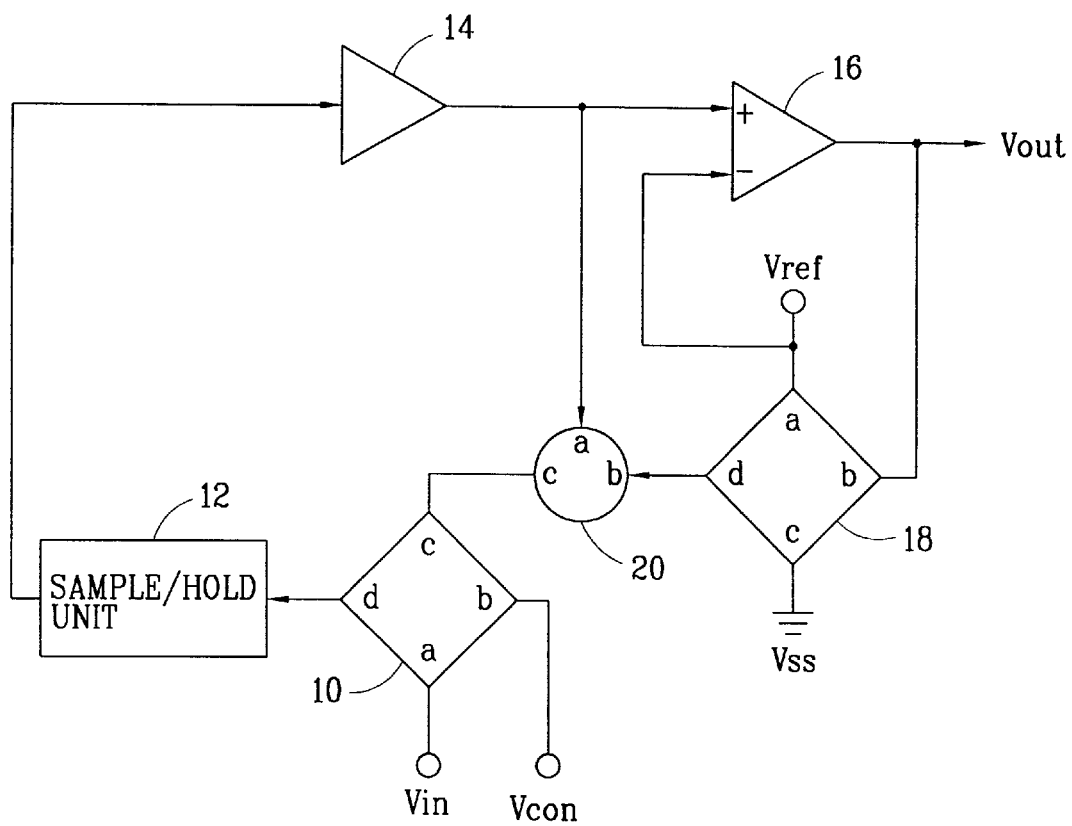
FIG. 1 is a block diagram illustrating a conventional cyclic analog/digital converter.
Figure 2:
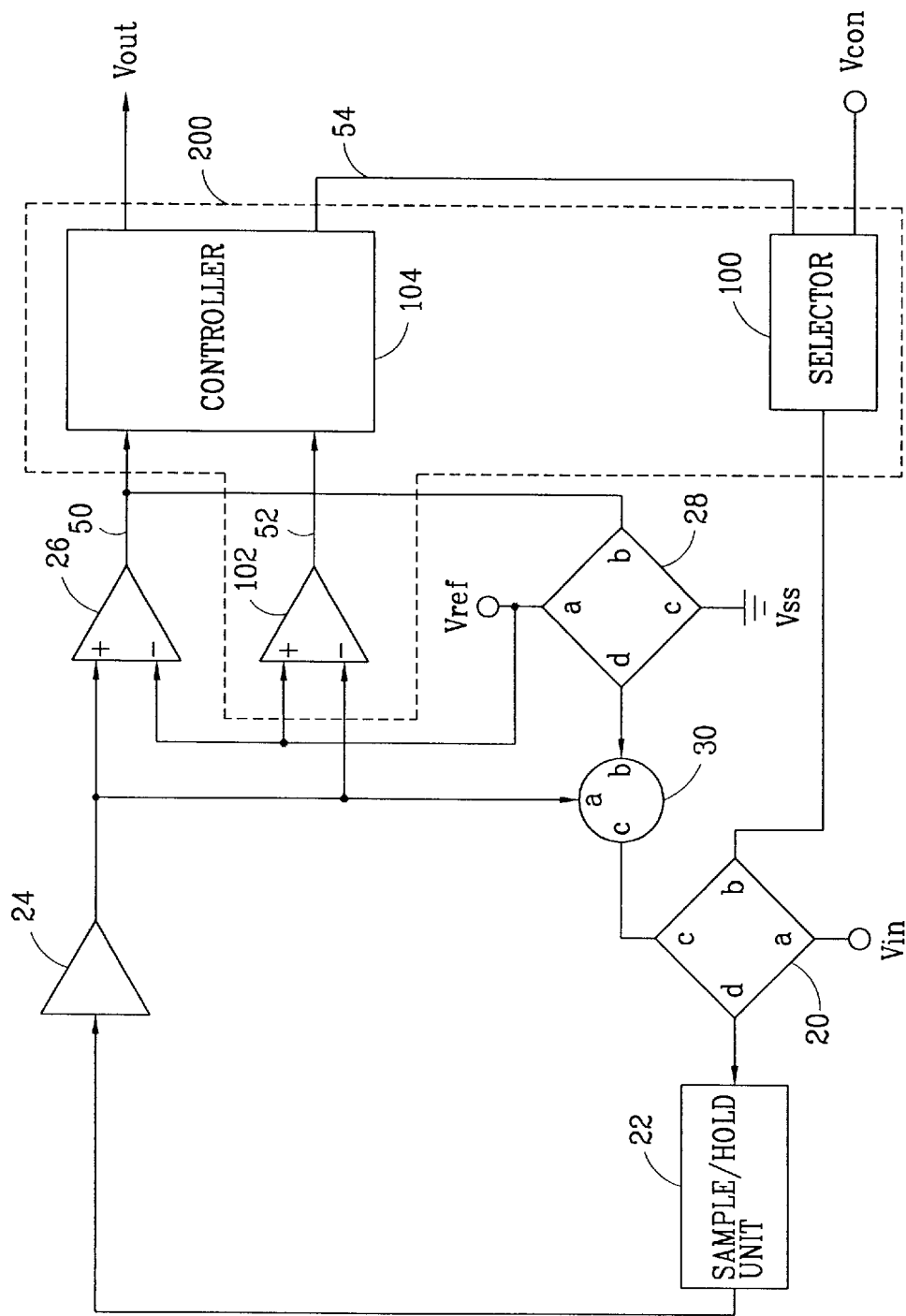
FIG. 2 is a block diagram illustrating a cyclic analog/digital converter according to one embodiment of the present invention.

FIG. 2 illustrates a cyclic analog/digital converter according to a preferred embodiment of the present invention. The cyclic analog/digital converter of the present invention includes a first multiplexer 20, a sample/hold unit 22, a doubling amplifier 24, a first comparator 26, a second multiplexer 28, a voltage subtractor 30, and a mis-operation detector 200.

The first and second multiplexers 20 and 28 each includes three input ports (a–c) and an output port (d), with the input port (b) functioning as a control port. The voltage subtractor 30 includes two input ports (a, b) and an output port (c).

Figure 5:
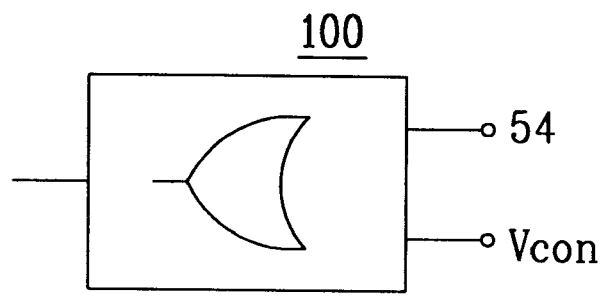
FIG. 5 illustrates an embodiment of a selector in FIG. 2.

The mis-operation detector 200 includes a selector 100, a second comparator 102, and a controller 104. The second comparator 102 has a non-inverting terminal and an inverting terminal. The first comparator 26 also has a non-inverting terminal and an inverting terminal. The non-inverting terminal of the first comparator 26 is connected to the inverting terminal of the second comparator 102. The inverting terminal of the first comparator 26 is connected to the non-inverting terminal of the second comparator 102. The other conditions of the first and second comparators 26 and 102 are identically set. As shown in FIG. 5, the selector 100 includes an OR gate.

The operation of the cyclic analog/digital converter according to the present invention will not be described with reference to the accompanying drawings.

As shown in FIG. 2, when a high-level control signal $V_{CON}$ is externally applied, the selector 100 outputs the high-level control signal $V_{CON}$ to an input port (b) of the first multiplexer 20. The control signal $V_{CON}$ is at a high-level only at the time of sampling, and it is at a low-level at all other times.

The first multiplexer 20 outputs to its output port (d) an analog signal $V_{IN}$ inputted through its input port (a) according to the high-level control signal $V_{CON}$ outputted from the selector 100. The analog signal $V_{IN}$ outputted from the first multiplexer 20 is sampled/held in the sample/hold unit 22 and inputted to the doubling amplifier 24. The doubling amplifier 24 outputs the output signal from the sample/hold unit 22 as it is to the first and second comparators 26 and 102.

The first comparator 26 receives the output signal from the doubling amplifier 24 through its non-inverting terminal (+), and receives the reference signal $V_{REF}$ through its inverting terminal (−). The second comparator 102 receives the reference signal $V_{REF}$ through its non-inverting terminal (+), and receives the output signal from the doubling amplifier 14 through its inverting terminal (−). The non-inverting and inverting terminals of the first and second comparators 26 and 102 are oppositely connected. Thus, output levels of the first and second comparators 26 and 102 are different during the normal operation. The controller 104 compares the output signals 50, 52 from the first and second comparators 26 and 102, and discriminates an operational state of the first comparator 26.

The controller 104 outputs a low-level discrimination signal 54 indicating that the first comparator 26 is normally operated, when the levels of the output signals 50 and 52 are different. The controller 104 outputs a high-level discrimination signal 54 indicating that the first comparator 26 is abnormally operated, when the output signals 50 and 52 have an identical level.

Figure 3:
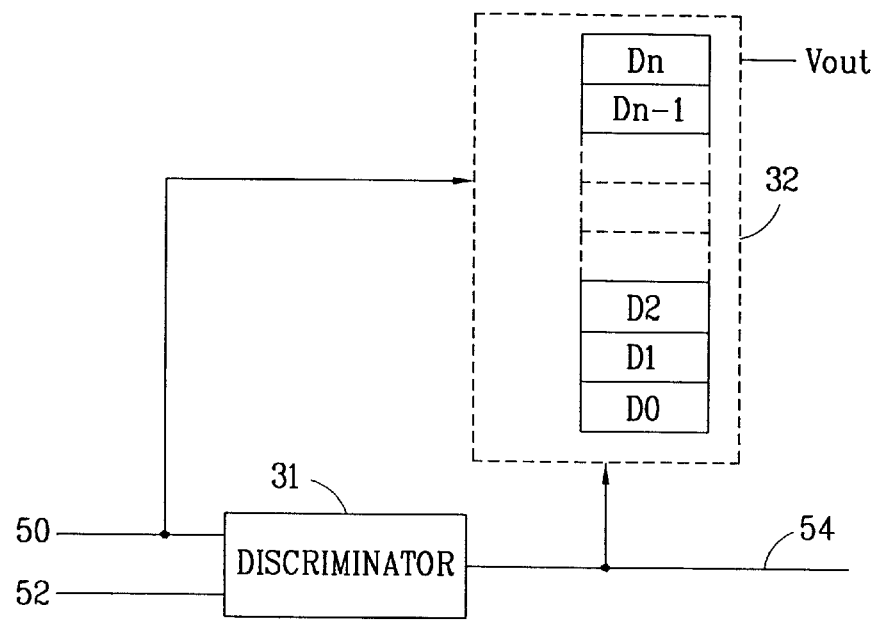
FIG. 3 illustrates an embodiment of a controller in FIG. 2.

FIG. 3 illustrates a preferred embodiment of the controller 104.

The discriminator 31 discriminates whether the output signals 50 and 52 from the first and second comparators 26 and 102 are different from each other. The storing unit 32 has an one bit serial output structure, thereby sequentially storing the output signals from the first comparator 26 pursuant to the discrimination signal 54.

Here, the storing unit 32 may use two types of storing methods.

In the first storing method, a first output signal 50 from the first comparator 26 is stored in Dn(MSB), and a next-succeeding output signal 50 is stored in Dn-1. A final output signal 50 from the first comparator 26 is stored in D0(LSB) in the same manner. Here, addresses in the storing unit 32 are all different.

In the second storing method, the output signals from the first comparator 26 are sequentially stored in D0, values which are precedently stored therein are sequentially shifted, and a value firstly inputted to D0 is positioned in Dn. Here, the storing unit 32 has an identical address.

Figure 4:
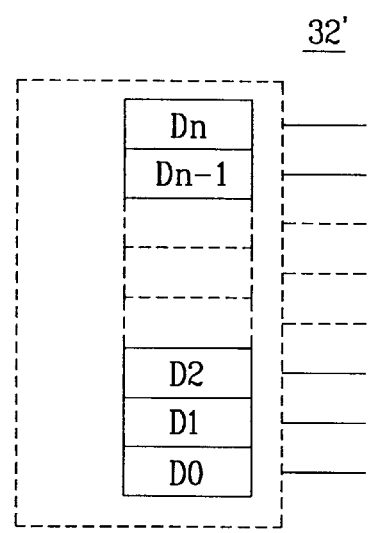
FIG. 4 illustrates another embodiment of a storing unit in FIG. 3.

In addition, the cyclic analog/digital converter of the present invention may employ the storing unit 32' having an one to n bits parallel output structure, as illustrated in FIG. 4.

(1) In Normal Operation

In the case that the output levels of the first and second comparators 26 and 102 are different, the discriminator 31 outputs the low-level discrimination signal 54, and the storing unit 32 stores the output signal 50 from the first comparator 26 in Dn as a most significant bit MSB pursuant to the low-level discrimination signal 54.

On the other hand, the second multiplexer 28 outputs the reference signal $V_{REF}$ when the output signal 50 from the first comparator 26 is at the high level, and outputs the ground voltage $V_{SS}$ when the output signal 50 thereof is at the low level. The voltage subtracter 30 subtracts the output signal from the doubling amplifier 24 inputted through its input port (a) and the output signal from the second multiplexer 28 inputted through its input port (b), and provides a subtraction result to the input terminal (c) of the first multiplexer 20 through its output port (c). The selector 100 outputs the low-level signal to the input port (b) of the first multiplexer 20 according to the low-level discrimination signal 54 and control signal $V_{CON}$.

Thus, the first multiplexer 20 outputs an output signal from the subtracter 30 inputted through its input terminal (c) to the sample/hold unit 22 through its output port (d). The doubling amplifier 24 amplifies the output signal from the sample/hold unit 22 two times, and outputs it to the first and second comparators 26 and 102.

Accordingly, as described above, the controller 104 compares the output signals 50 and 52 from the first and second comparators 26 and 102, thereby discriminating the operational state of the first comparator 26. Here, in the case that the two output signals 50 and 52 are different, the controller 104 stores the output signal 50 from the first comparator 26 in Dn-1 of the storing unit 32, and assigns it to a next-succeeding bit value of the digital signal.

A desired N bits digital signal can thus be obtained by repeatedly carrying out the above-described process.

(2) In Mis-Operation

When the levels of the output signals 50 and 52 from the first and second comparators 26 and 102 are identical, the discriminator 31 of the controller 104 outputs the high-level discrimination signals 54. The storing unit 32 is reset by the high-level discrimination signal 54, and thus abandons the currently-stored data. Here, the selector 100 applies the high-level discrimination signal 54 outputted from the controller 104 to the input port (b) of the first multiplexer 20. The first multiplexer 20 outputs the analog signal $V_{IN}$ inputted through its input port (a) to the sample/hold unit 22, and thus the digital conversion process is re-started. This process is repeatedly performed until a least significant bit of the N bits digital signal is determined.

As discussed earlier, the cyclic analog/digital converter of the present invention is capable of avoiding a wrong output caused by an offset voltage of the comparator or an instant change thereof, thereby more exactly converting the analog signal to the digital one.

It will be apparent to those skilled in the art that various modifications and variations can be made in the cyclic analog/digital converter of the present invention without departing from the spirit or scope of the invention. Thus, it is intended that the present invention covers modifications and variations of this invention provided they come within the scope of the appended claims and their equivalents.

What is claimed is:

1. A cyclic analog/digital converter comprising:
   a first multiplexer for selectively outputting an analog signal and a first input signal pursuant to a control signal;
   a sample/hold unit for sampling/holding an output signal from the first multiplexer;
   a doubling amplifier for amplifying an output signal from the sample/hold unit;
   a first comparator for comparing an output signal from the doubling amplifier with a reference voltage;
   a second multiplexer for selectively outputting the reference voltage and a ground voltage pursuant to an output signal from the first comparator;
   a voltage subtracter for subtracting output signals from the doubling amplifier and the second multiplexer, and providing the first input signal to the first multiplexer; and
   a mis-operation detector for detecting a mis-operation of the first comparator, and controlling an operation of the first multiplexer.

2. The cyclic analog/digital converter of claim 1, wherein the mis-operation detector comprises:
   a second comparator having two input terminals connected oppositely to two input terminals of the first comparator;
   a controller for receiving the output signal from the first comparator and an output signal from the second comparator, discriminating an operational state of the first comparator, and storing the output signal from the first comparator as a decision bit according to a discrimination signal; and
   a selector for selectively outputting the discrimination signal of the controller and an external control signal as the control signal to the first multiplexer.

3. The cyclic analog/digital converter of claim 2, wherein the controller comprises:
   a discriminator for comparing output levels of the first and second comparators, and outputting the discrimination signal; and a storing unit for storing the output signal from the first comparator according to the discrimination signal from the discriminator.

4. The cyclic analog/digital converter of claim 3, wherein the storing unit comprises either a one bit serial output structure or an n bits parallel output structure.

5. The cyclic analog/digital converter of claim 3, wherein the storing unit stores the output signal from the first comparator pursuant to the discrimination signal when the output levels of the first and second comparators are different, and is reset by the discrimination signal when the output levels of the first and second comparators are identical.

6. The cyclic analog/digital converter of claim 2, wherein the controller determines that the first comparator is operating normally when output levels of the first and second comparators are different, and determines that the first comparator is operating abnormally when the output levels of the first and second comparators are identical.

7. The cyclic analog/digital converter of claim 2, wherein the selector comprises an OR gate, and the control signal is at a high-level only during a sampling period of the sample/hold unit.

8. The cyclic analog/digital converter of claim 1, wherein the first multiplexer carries out a sampling operation by providing the analog signal to the sample/hold unit when the mis-operation of the first comparator is detected by the mis-operation detector.

9. A cyclic analog/digital converter comprising:
a first multiplexer for selectively outputting an analog signal and a first input signal pursuant to a control signal;
a sample/hold unit for sampling/holding an output signal from the first multiplexer;
a doubling amplifier for amplifying an output signal from the sample/hold unit;
first and second comparators for comparing an output signal from the doubling amplifier with a reference voltage;
a second multiplexer for selectively outputting the reference voltage and a ground voltage pursuant to an output signal from the first comparator;
a voltage subtracter for subtracting output signals from the doubling amplifier and the second multiplexer, and providing the first input signal to the first multiplexer;
a controller for receiving the output signal from the first comparator and an output signal from the second comparator, discriminating an operational state of the first comparator, and storing the output signal from the first comparator as a decision bit pursuant to a discrimination signal; and
a selector for selectively outputting the discrimination signal from the controller and an external control signal, and controlling an operation of the first multiplexer.

10. The cyclic analog/digital converter of claim 9, wherein the controller comprises:
a discriminator for outputting a high-level discrimination signal indicating that the first comparator is normally operated, when output levels of the first and second comparators are different; and
a storing unit for storing the output signal from the first comparator according to the high-level discrimination signal.

11. The cyclic analog/digital converter of claim 10, wherein the storing unit comprises one bit serial output structure or n bits parallel output structure.

12. The cyclic analog/digital converter of claim 10, wherein the storing unit stores the output signal from the first comparator as a decision bit according to the high-level discrimination signal, and is reset by a low-level discrimination signal indicating that the first comparator is abnormally operated.

13. The cyclic analog/digital converter of claim 9, wherein the selector comprises an OR gate, and the first multiplexer carries out a sampling operation by providing the analog signal to the sample/hold unit according to the output signal from the selector when a mis-operation of the first comparator is detected.

14. A mis-operation detecting circuit in a cyclic analog/digital converter having a first multiplexer for selectively outputting an analog signal and a first input signal pursuant to a control signal, a sample/hold unit for sampling/holding an output signal from the first multiplexer, a doubling amplifier for amplifying an output signal from the sample/hold unit, a first comparator for comparing an output signal from the doubling amplifier with a reference voltage, a second multiplexer for selectively outputting the reference voltage and a ground voltage pursuant to an output signal from the first comparator, and a voltage subtracter for subtracting output signals from the doubling amplifier and second multiplexer, and providing the first input signal to the first multiplexer, the mis-operation detecting circuit comprising:
a second comparator for comparing the output signal from the doubling amplifier with the reference voltage;
a discriminator for comparing output levels of the first and second comparators, and discriminating an operational state of the first comparator;
a storing unit for storing the output signal from the first comparator as a decision bit according to a discrimination signal from the discriminator; and
a selector for selectively outputting the discrimination signal and a first control signal as the control signal of the first multiplexer.

15. The mis-operation detecting circuit of claim 14, wherein the first and second comparators receive opposite inverting and non-inverting input signals, and output levels of the first and second comparators are different during a normal operation.

16. The mis-operation detecting circuit of claim 14, wherein the discriminator discriminates that the first comparator is normally operated when output levels of the first and second comparators are different, and discriminates that the first comparator is abnormally operated when the output levels of the first and second comparators are identical.

17. The mis-operation detecting circuit of claim 14, wherein the storing unit comprises one bit serial output structure or n bits parallel output structure.

18. The mis-operation detecting circuit of claim 14, wherein the storing unit stores the output signal from the first comparator as a decision bit when the first comparator is normally operated, and is reset by the discrimination signal when the first comparator is abnormally operated.

* * * * *